June 30, 1964 L. A. D'ASARO ETAL 3,139,362

METHOD OF MANUFACTURING SEMI-CONDUCTIVE DEVICES

Filed Dec. 29, 1961

INVENTORS L. A. D'ASARO
R. G. FRIESER
BY David P. Kelley
ATTORNEY 3,139,362

METHOD OF MANUFACTURING SEMI-CONDUCTIVE DEVICES

Lucian A. D'Asaro, Madison, and Rudolf G. Frieser, Neshanic Station, N.J., assignors to Bell Telephone Laboratories, Incorporated, New York, N.Y., a corporation of New York Filed Dec. 29, 1961, Ser. No. 163,342
1 Claim. (Cl. 148—187)

This invention relates to the manufacture of semi-conductive devices and, more particularly, to methods of diffusing donor material into a semi-conductive gallium arsenide body.

In recent years considerable semi-conductor research has been done on a broad class of substances known as intermetallic compounds. In these substances molecular bonding is primarily covalent and the presence of an impurity produces a significant effect on important physical properties such as carrier concentration and carrier mobility. These materials provide a much wider range of electrical properties than is possible with the elemental semi-conductors, germanium and silicon; this permits the construction of a broader variety of more versatile transistor-like devices. Of these, gallium arsenide is of particular potential importance because of its large band gap combined with high mobility.

In the manufacture of gallium arsenide semi-conductive devices, it is often desirable to introduce impurities by solid state diffusion. Diffusion, as used herein, describes the introduction of an impurity, called a diffusant, into a selected body, called a substrate, without any appreciable melting of the substrate, as opposed to the processes of fusion and alloying. Although acceptors, or p-type impurities, can be diffused into gallium arsenide with comparative ease, attempts to diffuse donor, or n-type, materials therein have been largely unsuccessful.

The most suitable donors are the group VI elements such as sulfur, selenium, and tellurium. These elements unfortunately tend to combine chemically with the gallium arenside substrate rather than diffuse into it. For example, when one attempts to diffuse selenium into gallium arsenide, a film of selenides such as gallium selenide are formed on the surface of the substrate.

Accordingly, it is an object of this invention to diffuse group VI elements into gallium arsenide.

It is another object of this invention to prevent group VI elements from chemically combining with gallium arsenide during the diffusion process.

These and other objects of our invention are attained in an illustrative method of manufacturing semi-conductive devices which comprises the step of exposing a sample of gallium arsenide to an environment containing a vaporized group VI element such as selenium.

According to one feature of this invention the gallium arsenide substrate is coated with a thin layer of aluminum oxide before exposure to the vaporized selenium. If the aluminum oxide coating is sufficiently thin, as for example, 5000 angstroms, it will permit the selenium to diffuse into the gallium arsenide but will prevent them from chemically combining. After the diffusion process the aluminum oxide coating is removed from the gallium arsenide substrate.

Figure 1:
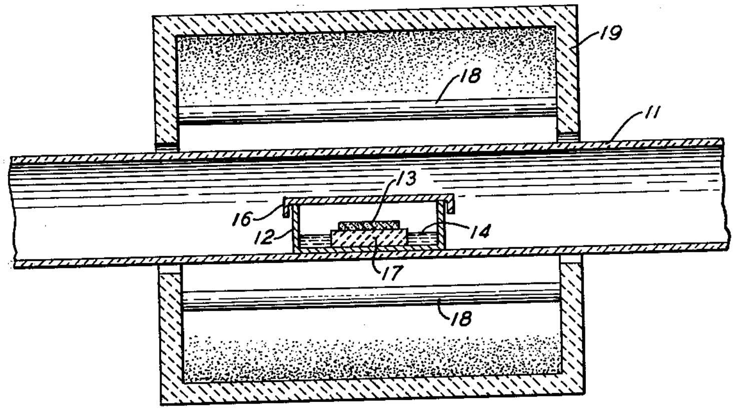
Figure 2:
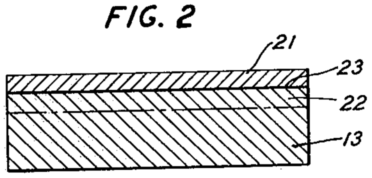

These and other objects and features of our invention will be more clearly understood from a consideration of the following detailed description, taken in conjunction with the accompanying drawing, in which:

FIG. 1 is a sectional view of apparatus for diffusing an impurity into gallium arsenide in accordance with one step of our invention; and FIG. 2 is a schematic view of a substrate of gallium arsenide that has been coated with aluminum oxide in accordance with another step of our invention.

Referring now to FIG. 1 there is shown apparatus for diffusing one material into another in accordance with the general principles described in the application of B. T. Howard, Serial No. 740,958, filed June 9, 1958. A covered box 12 containing a substrate 13 of p-type gallium arsenide and a diffusant 14 of selenium dissolved in a suitable solvent such as indium arsenide, are located within a furnace tube 11 which is preferably of fused silica. Box 12 is made of any of a number of known materials such as fused silica or platinum which is heat resistant and which does not emit impurities into the atmosphere when it is heated. A cover 16 permits a certain limited interchange of atmosphere between the interior and exterior of box 12. A platform 17 separates the substrate 13 from the diffusant 14.

A pair of heating rods 18 maintain the interior of box 12 at a proper predetermined temperature. An insulator 19 of asbestos or other appropriate material insulates heating rods 18 and box 12. An inert gas, such as argon, is transmitted along tube 11 and allowed to fill box 12.

In accordance with our invention the gallium arsenide substrate 13 is coated with a thin film 21 of aluminum oxide ($Al_2O_3$) as shown schematically in FIG. 2. The aluminum oxide is very thin, as for example, 5000 angstroms. After coating, substrate 13 is heated in box 12 at approximately 765° C. for approximately one hour. Under these conditions it has been found that some of the selenium diffusant 14 will vaporize and diffuse through coating 21 into substrate 13 to form an n-type diffused layer 22 as shown in FIG. 2.

An important aspect of this diffusion process is the fact that selenides are not formed as by-products thereof. Ordinarily, when gallium arsenide is exposed to an atmosphere of selenium, a coating of selenides such as gallium selenide are formed as a result of a surface reaction of the gallium arsenide with the selenium vapor. This coating inhibits, to a large extent, the diffusion of the selenium into the substrate. Even if diffusion does take place, it is not controllable or even predictable. Further, the formation of the selenide coating makes the manufacture of extremely small devices impossible.

It is believed that a chemical bond is formed between the aluminum oxide coating 21 and the substrate 13. It is quite probable that a film of gallium oxide is formed on the interface 23 between the substrate and the aluminum oxide coating. Gallium oxide ($Ga_2O_3$) has a crystalline structure that may be substantially identical to aluminum oxide ($Al_2O_3$) and so it is likely that these two substances are bonded chemically at their juncture at interface 23. It is this chemical bond that is believed to prevent a surface reaction of the gallium arsenide with the selenium. After the selenium diffuses into layer 22, it cannot combine chemically with the gallium or arsenic atoms because those atoms are bonded together and there are no free available valence electrons. Therefore, because of the chemical action of the aluminum oxide coating 21 with substrate 13, the surface atoms of the substrate are prohibited from reacting with the selenium to form selenides.

It should be pointed out that the foregoing discussion is only a hypothetical explanation of why our invention permits the diffusion of selenium into gallium arsenide. The gallium oxide region at interface 23 is probably less than one hundred atoms thick and so its existence is difficult to detect.

In the manufacture of a workable semi-conductive device, the substrate 13 is first doped with an appropriate acceptor impurity so that upon diffusion of the donor material, a p-n junction is formed. In the devices manufactured by us, substrate 13 was first doped with zinc.

to give the substrate a p-type characteristic. However, various combinations of known techniques can be employed and various different acceptor impurities can be used to produce different devices with different electrical characteristics. Also, our invention can be used for the diffusion of other group VI donors such as sulfur and tellurium into gallium arsenide.

After the diffusion process, the aluminum oxide coating 21 is removed from substrate 13. This is done conveniently by dissolving the aluminum oxide in hydrofluoric acid because hydrofluoric acid does not affect gallium arsenide.

In summary, we have found that a useful gallium arsenide semi-conductor can be made by the steps of: doping a gallium arsenide substrate with an acceptor impurity by known techniques; coating the substrate with a film of aluminum oxide of less than 10,000 angstroms; exposing the substrate to an atmosphere of selenium vapor or some other vaporized group VI element for approximately one hour at a temperature of 750° C. or more; removing the aluminum coating as by dissolving the coating in hydrofluoric acid. Aluminum oxide thicknesses of more than 10,000 angstroms are impractical because of the prohibitively long time that is thereby required for diffusion of the selenium through the coating. Temperatures of less than 750° C. are impractical because the rate of diffusion is thereby reduced to a prohibitively great degree. The only upper limit of temperature appears to be the temperatures at which the aluminum oxide or gallium arsenide will begin to melt. The only lower limit of coating thickness appears to be that of fabrication convenience; it is very difficult, if not impossible, to make a coating of less than 50 angstroms that dependably covers an entire surface, and such a thin coating does not give any particular advantages. Various modifications of this process may be made by one skilled in the art without departing from the spirit and scope of the invention.

What is claimed is:

A method of diffusing donor atoms into a gallium arsenide semiconductive wafer for forming a donor-rich surface region in the wafer comprising the steps of forming a coating of aluminum oxide between 50 angstroms and 10,000 angstroms thick on a surface of said wafer, and then heating the wafer in an atmosphere containing the vapor of a donor taken from the group consisting of selenium, sulfur, and tellurium at a temperature higher than 750° C. and less than the melting point of aluminum oxide and gallium arsenide for the diffusion of the donor into the wafer.

References Cited in the file of this patent

UNITED STATES PATENTS

| | | |
|---|---|---|
| 2,802,760 | Derick et al. | Aug. 13, 1957 |
| 2,823,149 | Robinson | Feb. 11, 1958 |
| 2,928,761 | Gremmelmaier et al. | Mar. 15, 1960 |